United States Patent
Cha et al.

(10) Patent No.: US 8,546,883 B2
(45) Date of Patent: Oct. 1, 2013

(54) SEMICONDUCTOR DEVICE

(75) Inventors: Jae-Han Cha, Cheongju-si (KR);
Kyung-Ho Lee, Cheongju-si (KR);
Sun-Goo Kim, Cheongju-si (KR);
Hyung-Suk Choi, Cheongju-si (KR);
Ju-Ho Kim, Cheongju-si (KR);
Jin-Young Chae, Cheongju-si (KR);
In-Taek Oh, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 65 days.

(21) Appl. No.: 12/835,523

(22) Filed: Jul. 13, 2010

(65) Prior Publication Data
US 2011/0115020 A1    May 19, 2011

(30) Foreign Application Priority Data
Nov. 17, 2009   (KR) .................. 10-2009-0110926

(51) Int. Cl.
*H01L 29/66*   (2006.01)
(52) U.S. Cl.
USPC .................. 257/343; 257/335; 257/E29.261
(58) Field of Classification Search
USPC .................. 257/335, 343, E29.261
See application file for complete search history.

(56) References Cited

U.S. PATENT DOCUMENTS

| 6,730,962 | B2 | 5/2004 | Wu |
| 6,888,207 | B1 | 5/2005 | Hebert |
| 2005/0082603 | A1* | 4/2005 | Fujii .................. 257/328 |

FOREIGN PATENT DOCUMENTS

JP    2008-091889    4/2008

OTHER PUBLICATIONS

Office Action used on May 27, 2011 in corresponding foreign patent application, Koren Application No. 10-2009-0110926 filed on Nov. 17, 2009 (4 pages—No Translation).
Notice of Allowance issued by the Korean Intellectual Property Office in correspondence foreign patent application Korean Application No. 10-2009-0110926 on Jan. 11, 2012 (5 Pages, No Translation).

* cited by examiner

*Primary Examiner* — Marvin Payen
(74) *Attorney, Agent, or Firm* — NSIP Law (57) ABSTRACT

A semiconductor device includes a second conductive-type deep well configured above a substrate. The deep well includes an ion implantation region and a diffusion region. A first conductive-type first well is formed in the diffusion region. A gate electrode extends over portions of the ion implantation region and of the diffusion region, and partially overlaps the first well. The ion implantation region has a uniform impurity concentration whereas the impurity concentration of the diffusion region varies from being the highest concentration at the boundary interface between the ion implantation region and the diffusion region to being the lowest at the portion of the diffusion region that is the farthest away from the boundary interface.

3 Claims, 4 Drawing Sheets

SEMICONDUCTOR DEVICE

CROSS-REFERENCE TO RELATED APPLICATIONS

The present application claims priority 35 U.S.C. §119 of Korean Patent Application No. 10-2009-110926, filed on Nov. 17, 2009, which is incorporated herein by reference in its entirety.

TECHNICAL FIELD

The following description relates generally to fabrication of a semiconductor device, and, for example, a high-voltage MOS transistor.

BACKGROUND OF RELATED ART

A lateral double-diffused MOS (LDMOS) transistor based on planar diffusion technology is generally used as a high-voltage MOS transistor. Owing to the higher input impedance in comparison to a bipolar transistor, an LDMOS transistor can realize a high power gain and/or a simpler gate driving circuit. Since an LDMOS transistor is a unipolar device, it advantageously exhibits little or no time delay when being turned off. The time delay usually originates from accumulated hydrophobic carriers.

Figure 1:
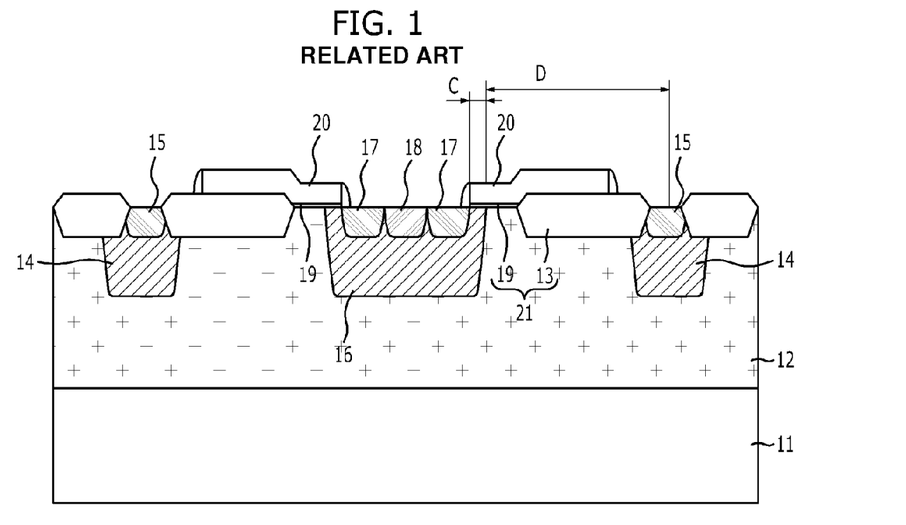
FIG. 1 is a cross-sectional view illustrative of a conventional lateral double-diffused MOS (LDMOS) transistor.

FIG. 1 is a cross-sectional view illustrative of a conventional LDMOS transistor. The drawing illustrates two LDMOS transistors having an N channel arrayed over a substrate in a right and left symmetrical structure with a bulk pick-up region at the center.

Referring to FIG. 1, the conventional LDMOS transistor includes an N-type deep well 12 formed over a P-type substrate 11 to have a uniform impurity doping concentration throughout the entire region, an N-type well 14 and a P-type well 16 disposed in the N-type deep well 12 with a predetermined distance from each other, an N-type source region 17 and a P-type bulk pick-up region 18 formed in the P-type well 16, an N-type drain region 15 formed in the N-type well 14, a gate electrode 20 formed between the source region 17 and the drain region 15, and an insulation layer 21 interposed between the gate electrode 20 and the substrate 11. The insulation layer 21 includes a gate insulation layer 19 and a field oxide layer 13.

Design consideration for a high-voltage MOS transistor includes the minimizing of the specific on resistance (RSP) while maintaining a high breakdown voltage (BV) may be desirable.

In order to improve the breakdown voltage in the LDMOS transistor having the above-described structure, the impurity doping concentration should be reduced in the N-type deep well 12 or in a drift region (D). The area where the gate electrode 20 and the P-type well 16 overlap functions as a channel region C whereas the area from the end of the channel region C to the N-type drain region 15 is the drift region D.

When the impurity doping concentration is decreased in the N-type deep well 12 or in the drift region D in order to secure a sufficiently high breakdown voltage, the specific on resistance increases to thereby adversely affecting the operational current characteristic of the LDMOS transistor. Conversely, when the impurity doping concentration is increased in the N-type deep well 12 or in the drift region D in order to secure suitable operational current characteristic, the breakdown voltage characteristic may be adversely impacted. In other words, the breakdown voltage characteristic and the operational current characteristic may be considered as traded offs with respect to the impurity doping concentration of the N-type deep well 12 or the drift region D. It is thus desirable to secure both breakdown voltage characteristic and operational current characteristic that are suitable for a high-voltage MOS transistor.

SUMMARY

General aspects of the following description are directed to a semiconductor device exhibiting both the breakdown voltage characteristic and the operational current characteristic suitable for use as a high-voltage semiconductor device.

Various other features and aspects will be understood by and become apparent from the following description.

In accordance with a general aspect, a semiconductor device may be provided to include a second conductive-type deep well, a first conductive-type first well and a gate electrode. The second conductive-type deep well may be formed above a substrate to include a first ion implantation region and a first diffusion region. The first conductive-type first well may be formed in the second conductive-type deep well and in contact with the first diffusion region. The gate electrode may be formed above the substrate to extend across portions of both the first ion implantation region and the first diffusion region, and may have one end portion thereof overlapped with a portion of the first conductive-type first well. The first diffusion region may have impurity doping concentration that is the highest at the interface between the first ion implantation region and the first diffusion region, and that decreases as moving farther away from the interface between the first ion implantation region and the first diffusion region.

The semiconductor device may further include a second conductive-type buried impurity layer formed below the second conductive-type deep well. The second conductive-type buried impurity layer may have a uniform impurity doping concentration.

The uniform impurity doping concentration of the second conductive-type buried impurity layer may be higher than the impurity doping concentration of the second conductive-type deep well at the interface between the first ion implantation region and the first diffusion region.

The semiconductor device may further include a first conductive-type bulk pick-up region configured in the first conductive-type first well. The impurity doping concentration of the first diffusion region may be the lowest in the portion of the first diffusion region below the first conductive-type bulk pick-up region.

The first ion implantation region may be formed through an impurity ion implantation process. The first diffusion region may be formed by diffusing the implanted impurity in a portion of the first ion implantation region.

The semiconductor device may further include an insulation layer interposed between the substrate and the gate electrode, a second conductive-type source region configured in the first conductive-type first well and adjacent the gate electrode, a second conductive-type drain region configured in the first ion implantation region and spaced apart from the gate electrode and a second conductive-type second well configured in the first ion implantation region to surround the second conductive-type drain region.

The semiconductor device may further include a second conductive-type buried impurity layer that includes a second ion implantation region formed below the first ion implantation region and a second diffusion region formed below the first diffusion region. The second diffusion region may have impurity doping concentration that decreases as moving farther away from an interface between the second ion implantation region and the second diffusion region.

The second ion implantation region may have impurity doping concentration that is higher than that of the first ion implantation region.

The first diffusion region may have a line width that is wider than that of the second diffusion region.

The impurity doping concentration of the second diffusion region may be the lowest in a portion of the second diffusion region below the first conductive-type bulk pick-up region.

According to another aspect, a semiconductor device may be provided to include a second conductive-type deep well, a second conductive-type buried impurity layer, a first conductive-type first well and a gate electrode. The second conductive-type deep well may be formed above a first conductive-type substrate. The second conductive-type buried impurity layer may be formed below the second conductive-type deep well to include an ion implantation region and a diffusion region. The first conductive-type first well may be formed in the diffusion region of the second conductive-type deep well. The gate electrode may be formed above the substrate to extend across portions of both the first ion implantation region and the first diffusion region, and may have one end portion thereof overlapped with a portion of the first conductive-type first well. The diffusion region may have the impurity doping concentration that is the highest at an interface between the ion implantation region and the diffusion region, and that decreases as moving farther away from the interface between the ion implantation region and the diffusion region.

The ion implantation region may have impurity doping concentration that is higher than the impurity doping concentration of the second conductive-type deep well.

The semiconductor device may further include a first conductive-type bulk pick-up region configured in the first conductive-type first well. The impurity doping concentration of the diffusion region may be the lowest in a portion of the diffusion region below the first conductive-type bulk pick-up region.

The ion implantation region may be formed through an impurity ion implantation process. The diffusion region may be formed by diffusing impurity in a portion of the ion implantation region.

The semiconductor device may further include an insulation layer interposed between the substrate and the gate electrode, a second conductive-type source region configured in the first conductive-type first well and adjacent the gate electrode, a second conductive-type drain region configured in the second conductive-type deep well and spaced apart from the gate electrode and a second conductive-type second well configured in the ion implantation region to surround the second conductive-type drain region.

According to yet another aspect, a semiconductor device may be provided to include a substrate of first conductivity type and a semiconductor layer of second conductivity type formed above the substrate. The semiconductor layer may include a first region having a uniform impurity concentration that is substantially uniform throughout the first region and a second region of varying impurity concentration that is the highest at a boundary between the first and second regions, and that is the lowest farthest away from the boundary.

The semiconductor device may include a lateral double-diffused metal oxide semiconductor (LDMOS) transistor, and may further comprise a first well of first conductivity type formed in the second region of the semiconductor layer, a source region of second conductivity type being formed in the first well and a second well of second conductivity type formed in the first region of the semiconductor layer, a drain region of second conductivity type being formed in the second well.

The semiconductor device may further include a buried impurity layer of second conductivity type formed between the substrate and the semiconductor layer, the buried impurity layer having an impurity concentration that is higher than the uniform impurity concentration of the first region of the semiconductor layer.

The buried impurity layer may include a first impurity layer region and a second impurity layer region. The first impurity layer region may have an impurity concentration that is substantially uniform throughout the first impurity layer region and that is higher than the uniform impurity concentration of the first region of the semiconductor layer. The second impurity layer region may have impurity concentration that varies across the second impurity layer region in such a manner that the impurity concentration of the second impurity layer region is the highest at a region boundary between the first and second impurity layer regions, and is the lowest farthest away from the region boundary.

BRIEF DESCRIPTION OF THE DRAWINGS

Various features and aspects of the disclosure will become more apparent by the following detailed description with reference to the attached drawings, of which.

DETAILED DESCRIPTION

General aspects will be described below in detail with reference to the accompanying drawings. It should be understood that these aspects are not intended, and should not be construed, to limit the full scope of the following description, and that aspects and features of the following description may be carried out with different configurations and elements than specifically detailed therein. Rather, these aspects are provided so that this description will be thorough and complete, and will fully convey the scope of the following description to those skilled in the art. Throughout the disclosure, like reference numerals refer to like parts throughout the various figures and aspects of the following description. The drawings are not necessarily to scale and in some instances, proportions may have been exaggerated for the sake of clarity. When a first layer is referred to as being "on" a second layer or "on" a substrate, it not only refers to a case where the first layer is formed in direct contact with the second layer or the substrate, but also to a case where a third layer exists between the first layer and the second layer or the substrate.

Aspects of the following description described below provide a semiconductor device capable of satisfying the breakdown voltage (BV) characteristic and the operational current characteristic requirements of a high-voltage MOS transistor. To that end, according to aspects of the following description, the deep well or the drift region may be formed to have a sloped impurity doping concentration profile.

Hereafter, general aspects will be described in reference to a lateral double-diffused MOS (LDMOS) transistor having an N channel by way of an illustrative example. With respect to this example, the first conductive type is a P-type whereas the second conductive type is an N-type. Of course, various features and aspects of the present disclosure may equally be applicable to an LDMOS transistor having a P channel, in which case, the first and second conductive types are an N type and a P type, respectively.

Further, general aspect may be applicable to a high-voltage semiconductor device, other than an LDMOS transistor, such as, for example, a high-voltage MOS transistor, which may include, e.g., an extended drain MOS (EDMOS) transistor.

Figure 2A:
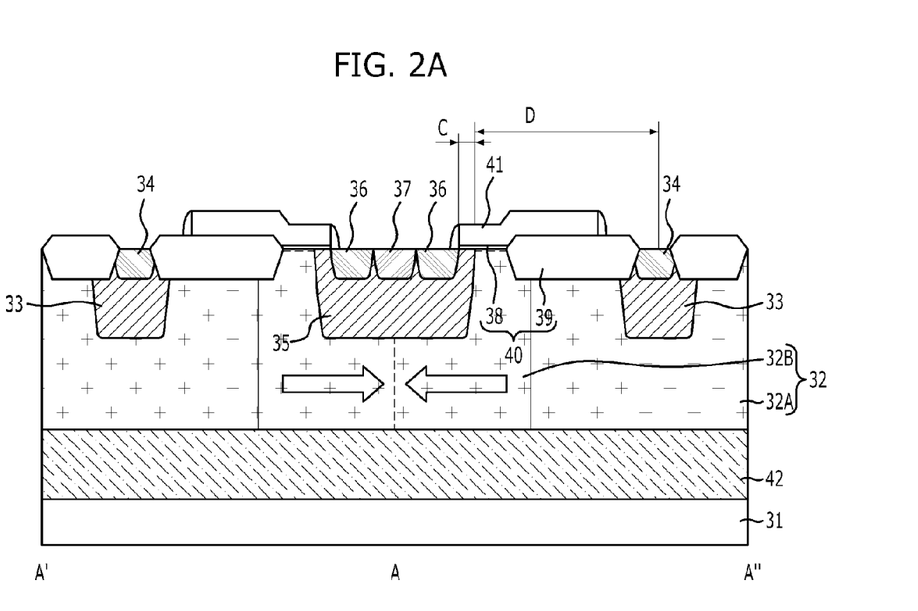
FIG. 2A is a cross-sectional view illustrative of an example of a LDMOS transistor in accordance with a general aspect.
Figure 2B:
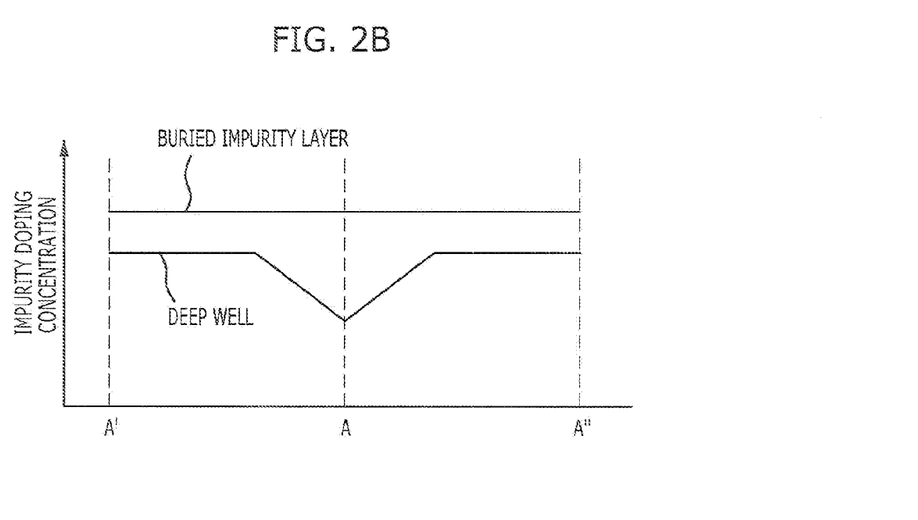
FIG. 2B is a graph showing an impurity doping concentration profile of a deep well and a buried impurity layer illustrated in FIG. 2A.

FIG. 2A is a cross-sectional view illustrating an example of a LDMOS transistor in accordance with a general aspect. FIG. 2B illustrates the respective impurity doping concentration profiles of the deep well and the buried impurity layer illustrated in FIG. 2A. Shown in the example of FIG. 2A are two LDMOS transistors each having an N channel arrayed over a substrate in a right and left symmetrical structure with a bulk pick-up region at the center.

Referring to FIGS. 2A and 2B, an LDMOS transistor according to a general aspect may include a deep well 32 formed over a first conductive-type substrate 31 to have an ion implantation region 32A and a diffusion region 32B, a first conductive-type first well 35 formed in the deep well 32 to contact the diffusion region 32B, a second conductive-type source region 36 formed in the first well 35, a second conductive-type drain region 34 formed in the ion implantation region 32A, a gate electrode 41 formed over the first conductive-type substrate 31 crossing both of the ion implantation region 32A and the diffusion region 32B and having one end thereof overlapped with a portion of the first well 35 and an insulation layer 40 interposed between the gate electrode 41 and the first conductive-type substrate 31.

The LDMOS transistor according to a general aspect may further include a first conductive-type bulk pick-up region 37 formed in the first well 35 and a second conductive-type second well 33 formed in the ion implantation region 32A to enclose the second conductive-type drain region 34. The first conductive-type bulk pick-up region 37 having a higher impurity doping concentration than the first well 35 may improve the contact characteristic with the first well 35. The second conductive-type second well 33 having a lower impurity doping concentration than the second conductive-type drain region 34 serves as an expanded drain region 34, and may improve the stability of the second conductive-type drain region 34 between operations. According to a general aspect, the second conductive-type second well 33 may have a higher impurity doping concentration than the deep well 32.

The LDMOS transistor according to a general aspect may further include a second conductive-type buried impurity layer 42 formed in the lower portion of the deep well 32. The second conductive-type buried impurity layer 42 may have a higher impurity doping concentration than the deep well 32, and may have a uniform impurity doping concentration throughout the entire region thereof. The second conductive-type buried impurity layer 42 improves the breakdown characteristic of the LDMOS transistor by preventing an excessive expansion of the depletion region from the first well 35 between operations, and thus improving the punch through voltage.

As for the first conductive-type substrate 31, a bulk silicon substrate or a support substrate, or a silicon-on-insulator (SOI) substrate where a buried insulation layer, and an epitaxial layer, e.g., epitaxial silicon layer, are sequentially stacked may be used, for example. When the SOI substrate is used as the first conductive-type substrate 31, the LDMOS transistor having the above-described structure may be formed in the epitaxial layer.

The gate electrode 41 may have its one end arrayed in the second conductive-type source region 36 and the other end spaced apart from the second conductive-type drain region 34 by a predetermined distance. The area where the first well 35 and the gate electrode 41 overlap is referred to herein as the channel region C whereas the area from one end of the channel region C (at the interface between the first well 35 and the deep well 32 below the gate electrode 41) to the second conductive-type drain region 34 is referred to herein as the drift region D.

The insulation layer 40 interposed between the gate electrode 41 and the first conductive-type substrate 31 may include a gate insulation layer 38 and a field oxide layer 39. The gate insulation layer 38 may be positioned in a region adjacent the second conductive-type source region 36. The field oxide layer 39 may be positioned in a region adjacent the second conductive-type drain region 34. The gate insulation layer 38 is thinner than the field oxide layer 39. The thickness of the gate insulation layer 38 may be selected in consideration of the voltage supplied to the gate electrode 41 in operation. The thickness of the field oxide layer 39 disposed in the lower portion of the gate electrode 41 may be selected based on the operating voltage applied to the gate electrode 41 as well.

The ion implantation region 32A of the deep well 32 has a uniform doping concentration. The diffusion region 32B may be formed by diffusing the implanted impurity into a portion of the ion implantation region 32A through a drive-in process or a diffusion process after the ion implantation region 32A is formed in a predetermined region of the first conductive-type substrate 31 through an impurity ion implantation process. As shown in FIG. 2B, the impurity doping concentration profile has a slope as the impurity doping concentration of the diffusion region 32B decreases as it goes farther from the interface between the ion implantation region 32A and the diffusion region 32B.

The impurity doping concentration is the lowest at the portion of the diffusion region 32B below the first conductive-type bulk pick-up region 37, and increases as it goes from the first conductive-type bulk pick-up region 37 toward the second conductive-type drain region 34. Further improvement in the breakdown voltage of the LDMOS transistor may be realized as the impurity doping concentration difference between the point where the impurity doping concentration is the lowest in the diffusion region 32B and the second conductive-type buried impurity layer 42 becomes larger while the diffusion region 32B and the second conductive-type buried impurity layer 42 have the same conductive type.

The line width of the diffusion region 32B of the deep well 32 may also be selected based on the operational voltage of the LDMOS transistor. That is, when a higher voltage is to be applied; it is generally desirable to increase the line width of the diffusion region 32B.

The LDMOS transistor according to a general aspect has a characteristic that the impurity doping concentration decreases in the diffusion region 32B as it goes farther from the interface between the ion implantation region 32A and the diffusion region 32B in order to ensure the suitability of both the breakdown voltage characteristic and the operational current characteristic.

That is, in order to improve the breakdown voltage characteristic, the impurity doping concentration of the deep well 32 or the drift region D should be lowered. However, lowering the impurity doping concentration of the deep well 32 or at the drift region D may increase the specific on resistance RSP, and thus has an adverse impact on the operational current characteristic.

A deep well 32 having the ion implantation region 32A and the diffusion region 32B that has a sloped impurity doping concentration can suppress the increase in the specific on resistance RSP because the deep well 32 has its impurity doping concentration decreasing only in the partial portion of the drift region D, that is, only in the diffusion region 32B of the drift region D. Further, since the impurity doping concentration in the diffusion region 32B has a slope, it is possible to effectively prevent the increase in the specific on resistance RSP. As described above, a deterioration in the operational current characteristic of the LDMOS transistor can be prevented by suppressing the increase in the specific on resistance RSP.

As the diffusion region 32B has a relatively low impurity doping concentration, the breakdown voltage characteristic of the LDMOS transistor between operations may be improved by diffusing the impurity doped in the ion implantation region 32A to thereby form the diffusion region 32B of the deep well 32. This is because the field across the PN junction formed between the deep well 32 and the first well 35 can be increased as the first well 35 is positioned in the diffusion region 32B having a relatively lower impurity doping concentration than the ion implantation region 32A. The impurity doping concentration inside the diffusion region 32B has a slope where the impurity doping concentration decreases along the direction from the second conductive-type drain region 34 toward the first well 35, or toward the first conductive-type bulk pick-up region 37. Thus, it is possible to effectively increase the field across the PN junction formed between the deep well 32 and the first well 35. With the above described structure, it is thus possible to effectively improve the breakdown voltage characteristic of the LDMOS transistor between operations.

When sufficient breakdown voltage characteristic of the LDMOS transistor is realized by using the deep well 32 including the ion implantation region 32A and the diffusion region 32B, the impurity doping concentration of the deep well 32 can be increased by providing the buried impurity layer 42, which may lead to an improved operational current characteristic of the LDMOS transistor. That is, with a sufficient breakdown voltage characteristic being achieved, the buried impurity layer 42 serves to complement the worsening of the breakdown voltage characteristic resulting from an increase in the impurity doping concentration of the deep well 32, making it possible to further improve the operation current characteristic, and to still realize a suitable breakdown voltage characteristic.

The LDMOS transistor formed according to a general aspect has the ion implantation region 32A and the diffusion region 32B that are both of the second conductive type. When however the diffusion is not sufficiently performed on the ion implantation region 32A in forming the diffusion region 32B, while the ion implantation region 32A has the second conductive type, conductivity type of the diffusion region 32B may become the first conductive type. When the diffusion region 32B has the first conductive type, an inversion region may be formed between the diffusion region 32B and the gate electrode 41 between operations, which may result in an increase in the specific on resistance, and may result in the abnormal operation of the LDMOS transistor. When the diffusion region 32B has the second conductive type as illustrated in the above embodiments of the present disclosure, an accumulation region is formed between the diffusion region 32B and the gate electrode 41.

When the diffusion is insufficiently performed when forming the diffusion region 32B, and when thus the diffusion region 32B comes to have the first conductive type, an impurity region need to be additionally formed in order to prevent the inversion region from being formed between the diffusion region 32B and the gate electrode 41. This may make the fabrication process complicated, and may increase the production cost. Therefore, it is desirable to form the diffusion region 32B by diffusing the implanted impurity into a portion of the ion implantation region 32A, so that the diffusion region 32B ends up having the same conductive type as the ion implantation region 32A.

Figure 3A:
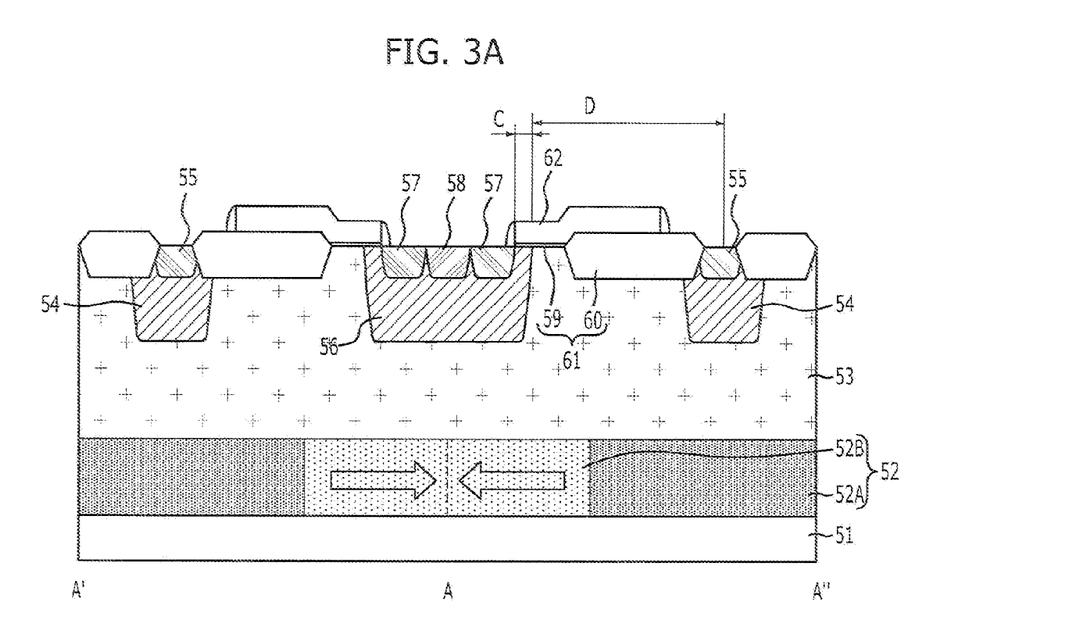
FIG. 3A is a cross-sectional view illustrating an example of a LDMOS transistor in accordance with another aspect.
Figure 3B:
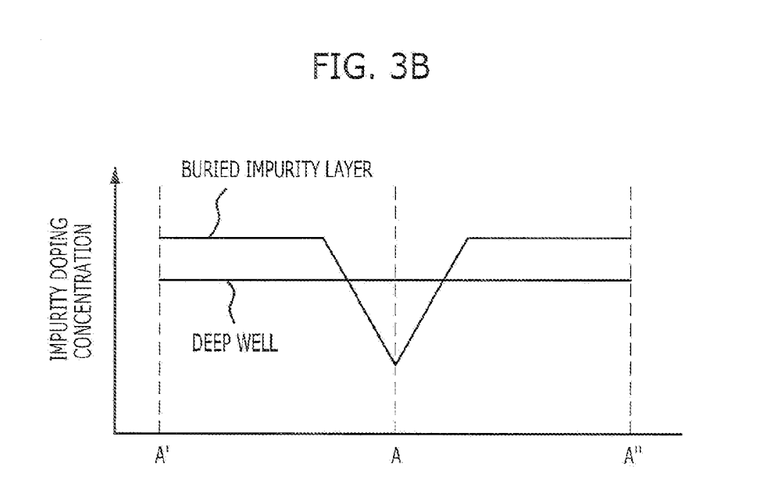
FIG. 3B is a graph showing an impurity doping concentration profile of a deep well and a buried impurity layer illustrated in FIG. 3A.

FIG. 3A is a cross-sectional view illustrating an example of a LDMOS transistor in accordance with another aspect. FIG. 3B shows the impurity doping concentration profiles respectively of the deep well and the buried impurity layer of FIG. 3A. Shown in the example of FIG. 3A are two LDMOS transistors each having an N channel arrayed over a substrate in a right and left symmetrical structure with the bulk pick-up region at the center.

Referring to FIGS. 3A and 3B, the LDMOS transistor according to another aspect may include a second conductive-type deep well 53 formed over a first conductive-type substrate 31 to have a uniform impurity doping concentration of a level sufficiently high in order to secure suitable operational current characteristic, a second conductive-type buried impurity layer 52 formed below the second conductive-type deep well 53 to have an ion implantation region 52A and a diffusion region 52B, a first conductive-type first well 56 formed in the deep well 53 to overlap with the diffusion region 52B, a second conductive-type source region 57 formed in the first well 56, a second conductive-type drain region 55 formed in the second conductive-type deep well 53 above the ion implantation region 52A, a gate electrode 62 formed over the first conductive-type substrate 51 extending over both of the ion implantation region 52A and the diffusion region 52B and having one end thereof overlapped with a portion of the first well 56 and an insulation layer 61 interposed between the gate electrode 62 and the first conductive-type substrate 51.

The LDMOS transistor according to another aspect may further include a second conductive-type second well 54 formed in the second conductive-type deep well 53 and a first conductive-type bulk pick-up region 58 formed in the first well 56 to surround the second conductive-type drain region 55. The first conductive-type bulk pick-up region 58 having a higher impurity doping concentration than the first well 56 improves the contact characteristic with the first well 56. The second conductive-type second well 54 having a lower impurity doping concentration than the second conductive-type drain region 55 functions as an expanded drain region 55, and may improve the stability with respect to the second conductive-type drain region 55 between operations. The second conductive-type second well 54 may have a higher impurity doping concentration than the second conductive-type deep well 53.

As for the first conductive-type substrate 51, a bulk silicon substrate or a support substrate, or a silicon-on-insulator (SOI) substrate where a buried insulation layer, and an epitaxial layer, e.g., epitaxial silicon layer, are sequentially stacked may be used, for example. When the SOI substrate is used as the first conductive-type substrate 51, the LDMOS transistor having the above-described structure may be formed in the epitaxial layer.

The gate electrode 62 may have one end thereof arrayed in the second conductive-type source region 57 and the other end spaced apart from the second conductive-type drain region 55 by a predetermined distance. The area where the first well 56 and the gate electrode 62 overlap each other is referred to herein as the channel region C whereas the area from one end of the channel region C (at the interface between the first well 56 and the second conductive-type deep well 53 below the gate electrode 62) to the second conductive-type drain region 55 is referred to herein as the drift region D.

The insulation layer 61 interposed between the gate electrode 62 and the first conductive-type substrate 51 may include a gate insulation layer 59 and a field oxide layer 60. The gate insulation layer 59 may be positioned in a region adjacent the second conductive-type source region 57. The field oxide layer 60 may be positioned in a region adjacent the second conductive-type drain region 55. The field oxide layer 60 is thicker than the gate insulation layer 59. The thickness of the gate insulation layer 59 may be selected in consideration of the voltage supplied to the gate electrode 62 in operation. The thickness of the field oxide layer 60 disposed in the lower portion of the gate electrode 62 may be selected based on the operating voltage applied to the gate electrode 62 as well.

The ion implantation region 52A of the second conductive-type buried impurity layer 52 has a uniform impurity doping concentration. The diffusion region 52B may be formed by diffusing the implanted impurity into a portion of the ion implantation region 52A through a drive-in process or a diffusion process after the ion implantation region 52A is formed in a predetermined region of the first conductive-type substrate 51 through an impurity ion implantation process. As shown in FIG. 3B, the impurity doping concentration of the diffusion region 52B has a slope as the impurity doping concentration of the diffusion region 52B decreases as it goes farther away from an interface between the ion implantation region 52A and the diffusion region 52B.

The second conductive-type deep well 53, the ion implantation region 52A, and the diffusion region 52B have the same conductive type, which is the second conductive type. The impurity doping concentration is the lowest at the portion of the diffusion region 52B below the first conductive-type bulk pick-up region 58, and increases as it goes from the first conductive-type bulk pick-up region 58 in the direction toward the second conductive-type drain region 55.

The ion implantation region 52A of the second conductive-type buried impurity layer 52 may have a higher impurity doping concentration than the second conductive-type deep well 53. The impurity doping concentration of the diffusion region 52B may be higher than, equal to, or lower than the second conductive-type deep well 53. Further improvement in the breakdown voltage of the LDMOS transistor may be realized as the impurity doping concentration difference between the point where the impurity doping concentration is the lowest in the diffusion region 52B and the second conductive-type deep well 53 becomes larger while the diffusion region 52B and the second conductive-type deep well 53 have the same conductive type (see FIG. 3B).

The line width of the diffusion region 52B of the second conductive-type buried impurity layer 52 may be selected based also on the operational voltage of the LDMOS transistor. That is, when a higher voltage is to be applied, it is desirable to increase the line width of the diffusion region 52B.

The LDMOS transistor according to another aspect has characteristics that the impurity doping concentration decreases in the diffusion region 52B as it goes farther away from the interface between the ion implantation region 52A and the diffusion region 52A while keeping the impurity doping concentration of the second conductive-type deep well 53 at a level that allows suitable operational current characteristic in order to secure the suitability of both the breakdown voltage characteristic and the operational current characteristic. In short, the second conductive-type buried impurity layer 52 complements the breakdown voltage characteristic deterioration due to the second conductive-type deep well 53 having an impurity doping concentration of a level that ensures the suitable operational current characteristic to thereby realize suitable breakdown voltage characteristic and operation current characteristic.

That is, the second conductive-type buried impurity layer 52 can improve the breakdown voltage characteristic of the LDMOS transistor by preventing an excessive expansion of the depletion region from the first well 56 between operations, thereby improving the punch through voltage.

The diffusion region 52B of the second conductive-type buried impurity layer 52 is formed by diffusing the impurity doped in the ion implantation region 52A. Thus, since the diffusion region 52B comes to have a relatively lower impurity doping concentration than the ion implantation region 52A, the breakdown voltage characteristic of the LDMOS transistor between operations may be improved. This is because the field across the PN junction formed between the deep well 32 and the first well 56 can be increased as the first well 56 is positioned above the diffusion region 52B which has a relatively lower impurity doping concentration than the ion implantation region 52A. Further, the impurity doping concentration in the diffusion region 52B has a slope where the impurity doping concentration decreases along the direction from the second conductive-type drain region 55 toward the first well 56, or toward the first conductive-type bulk pick-up region 58. Thus, it is possible to effectively increase the field across the PN junction formed between the deep well 53 and the first well 56. With the above described structure, it is thus possible to effectively improve the breakdown voltage characteristic of the LDMOS transistor between operations.

Since the impurity doping concentration of the diffusion region 52B is the lowest in the portion below the first conductive-type bulk pick-up region 58, the breakdown voltage characteristic for operational voltage can be effectively improved although the operational voltage is increased by increasing the expansion distance of the depletion region expanding from the first well 56 toward the first conductive-type substrate 51 between operations. When the second conductive-type buried impurity layer 52 has a uniform impurity doping concentration, the expansion distance of the depletion region expanding below the first conductive-type bulk pick-up region 58 between operations may be limited based on the distance between the lower surface of the first well 56 and the upper surface of the second conductive-type buried impurity layer 52. Thus, the width of the expansion region expanding from the first well 56 between operations, which is the width toward the first conductive-type substrate 51, cannot be increased beyond a predetermined operation voltage as the breakdown voltage characteristic deteriorates relatively as the operation voltage increases. However, with the structure described herein according to another aspect, since the impurity doping concentration is the lowest in the lower portion of the first conductive-type bulk pick-up region 58, the width of the depletion region expanding from the first well 56 to the first conductive-type substrate 51 between operations can be increased. The LDMOS transistor of the structure above described can more effectively prevent the deterioration of the breakdown voltage characteristic due to the increase in the operating voltage, when compared with an LDMOS transistor with a second conductive-type buried impurity layer that has a uniform impurity doping concentration.

Figure 4A:
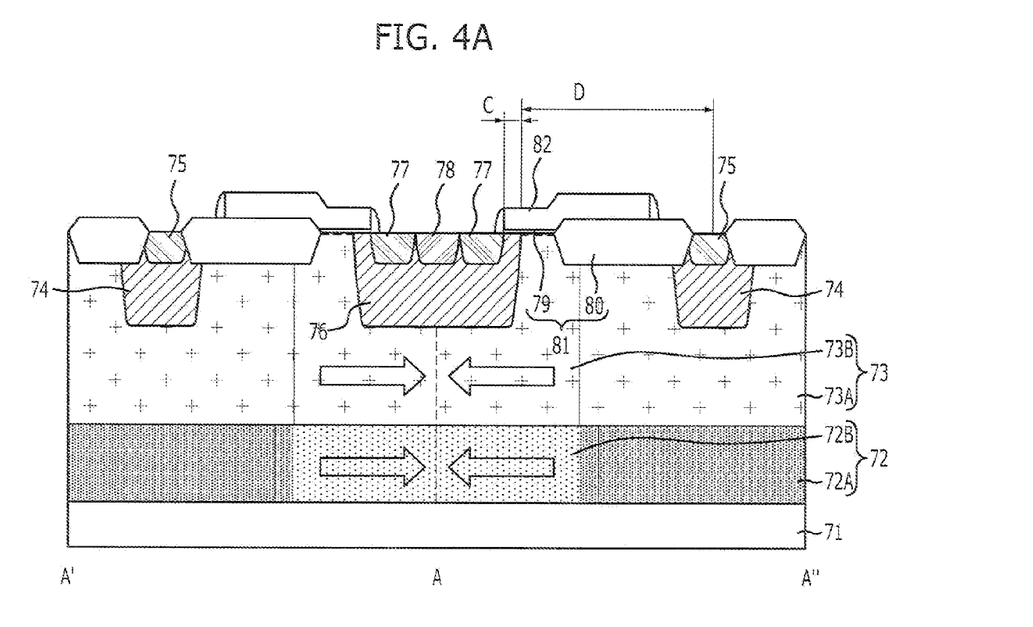
FIG. 4A is a cross-sectional view illustrating an example of a LDMOS transistor in accordance with yet another aspect.
Figure 4B:
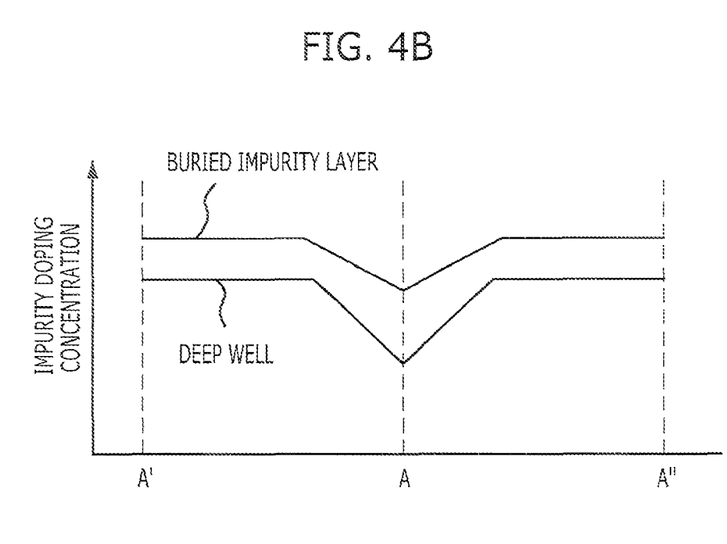
FIG. 4B is a graph showing an impurity doping concentration profile of a deep well and a buried impurity layer illustrated in FIG. 4A.

FIG. 4A is a cross-sectional view illustrating an LDMOS transistor in accordance with yet another aspect. FIG. 4B depicts the impurity doping concentration profiles respectively of the deep well and the buried impurity layer of FIG. 4A. By way of an illustrative example, two LDMOS transistors each with N channel arrayed over a substrate in a right to left symmetrical structure with the bulk pick-up region at the center are depicted in FIG. 4A.

Referring to FIGS. 4A and 4B, the LDMOS transistor according to yet another aspect may include a second conductive-type deep well 73 formed over a first conductive-type substrate 71 to include a first ion implantation region 73A and a first diffusion region 73B, a second conductive-type buried impurity layer 72 including a second ion implantation region 72A formed below the ion implantation region 73A and a second diffusion region 72B formed below the first diffusion region 73B, a first conductive-type first well 76 formed in the first diffusion region 73B, a second conductive-type source region 77 formed in the first well 76, a second conductive-type drain region 75 formed in the first ion implantation region 73A, a gate electrode 82 formed over the first conductive-type substrate 71 extending across both of the first ion implantation region 73A and the first diffusion region 73B (or across both the second ion implantation region 72A and the second diffusion region 72B and an insulation layer 81 interposed between the gate electrode 82 and the first conductive-type substrate 71. The gate electrode 82 has one end thereof overlapped with a portion of the first well 76.

The LDMOS transistor according to yet another aspect may further include a first conductive-type bulk pick-up region 78 formed in the first well 76 and a second conductive-type second well 74 formed in the first ion implantation region 73A to surround the second conductive-type drain region 75. The first conductive-type bulk pick-up region 78 having a higher impurity doping concentration than the first well 76 may improve the contact characteristic with the first well 76. The second conductive-type second well 74 having a lower impurity doping concentration than the second conductive-type drain region 75 functions as an expanded drain region 75, and may improve the stability with respect to the second conductive-type drain region 75 between operations. The second conductive-type second well 74 may have a higher impurity doping concentration than the first ion implantation region 73A.

As for the first conductive-type substrate 71, a bulk silicon substrate or a support substrate, or a silicon-on-insulator (SOI) substrate where a buried insulation layer, and an epitaxial layer, e.g., epitaxial silicon layer, are sequentially stacked may be used, for example. When the SOI substrate is used as the first conductive-type substrate 71, the LDMOS transistor having the above-described structure may be formed in the epitaxial layer.

The gate electrode 82 may have one end arrayed in the second conductive-type source region 77 and the other end spaced apart from the second conductive-type drain region 75 by a predetermined distance. The area where the first well 76 and the gate electrode 82 overlap each other is referred to herein as the channel region C whereas the area from an end of the channel region C (at the interface between the first well 76 and the second conductive-type deep well 73 below the gate electrode 82) to the second conductive-type drain region 75 is referred to herein as the drift region D.

The insulation layer 81 interposed between the gate electrode 82 and the first conductive-type substrate 71 may include a gate insulation layer 79 and a field oxide layer 80. The gate insulation layer 79 may be positioned in a region adjacent the second conductive-type source region 57. The field oxide layer 80 may be positioned in a region adjacent the second conductive-type drain region 75. The field oxide layer 80 is thicker than the gate insulation layer 79. The thickness of the gate insulation layer 79 may be selected based on the operational voltage to be applied to the gate electrode 82. The thickness of the field oxide layer 80 disposed in the lower portion of the gate electrode 82 may be selected based on the operating voltage applied to the gate electrode 82 as well.

The ion implantation region 73A of the second conductive-type deep well 73 has a uniform doping concentration. The first diffusion region 73B may be formed by diffusing the implanted impurity into a portion of the first ion implantation region 73A through a drive-in or diffusion process after the first ion implantation region 73A is formed in a predetermined region of the first conductive-type substrate 71 through an impurity ion implantation process. The impurity doping concentration of the first diffusion region 73B has a slope as the impurity doping concentration of the first diffusion region 73B decreases as it goes farther away from the interface between the first ion implantation region 73A and the first diffusion region 73B.

The second ion implantation region 72A of the second conductive-type buried impurity layer 72 has a uniform impurity doping concentration, has the same conductive type as the first ion implantation region 73A, and has a higher impurity doping concentration than the first ion implantation region 73A.

The second diffusion region 72B of the second conductive-type buried impurity layer 72 may be formed by diffusing the implanted impurity into a portion of the second ion implantation region 72A through a drive-in process or a diffusion process after the second ion implantation region 72A is formed in a predetermined region of the first conductive-type substrate 71 through an impurity ion implantation process. The impurity doping concentration of the second diffusion region 72B has a slope as the impurity doping concentration decreases as it goes farther away from the interface between the second ion implantation region 72A and the second diffusion region 72B. The second diffusion region 72B, the second ion implantation region 72A, the first ion implantation region 73A, and the first diffusion region 73B have the same conductive type, which is the second conductive type. The impurity doping concentration of the second diffusion region 72B may be higher than, equal to, or lower than the impurity doping concentration of the first diffusion region 73B.

In the first diffusion region 73B, the impurity doping concentration is the lowest at the portion of the first diffusion region 73B below the first conductive-type bulk pick-up region 78, and increases as it goes from the first conductive-type bulk pick-up region 78 toward the second conductive-type drain region 75. In the second diffusion region 72B, the impurity doping concentration is the lowest at the portion of the second diffusion region 72B below the first conductive-type bulk pick-up region 78, and increases as it goes from the first conductive-type bulk pick-up region 78 toward the second conductive-type drain region 75. As the impurity doping concentration difference between the point where the impurity doping concentration is the lowest in the first diffusion region 73B and the point where the impurity doping concentration is the lowest in the second diffusion region 72B becomes larger while the first diffusion region 73B and the second diffusion region 72B have the same conductive type, the breakdown voltage characteristic of the LDMOS transistor is improved.

The respective line widths of the first diffusion region 73B and the second diffusion region 72B may be determined based on the operational voltage of the LDMOS transistor. That is, when the applied voltage becomes higher, it is desirable to increase the line widths of the first diffusion region 73B and the second diffusion region 72B. The line width of the second diffusion region 72B may be wider than the line width of the first diffusion region 73B. This is because the impurity doping concentration of the second ion implantation region 72A is higher than the impurity doping concentration of the first ion implantation region 73A and thus the diffusion range of the second diffusion region 72B is longer than the diffusion range of the first diffusion region 73B during the diffusion process for forming the first diffusion region 73B and the second diffusion region 72B. The diffusion range is proportional to the temperature, and may also depend on the type of impurity and on the concentration of impurity. If the temperature and the type of impurity are kept the same, the diffusion range may be controlled based on the concentration of impurity.

The LDMOS transistor of the above-described structure according to yet another aspect may include the second conductive-type deep well 73 provided with the first ion implantation region 73A and the first diffusion region 73B, as well as the second conductive-type buried impurity layer 72 provided with the second ion implantation region 72A and the second diffusion region 72B. Accordingly, it may be possible to realize excellent characteristics both in terms of the operational current and the breakdown voltage, in comparison to LDMOS transistors fabricated according to the previously described aspects.

Aspects allow both breakdown voltage characteristic and operation current characteristic suitable for a high-voltage semiconductor device, by forming either a deep well or buried impurity layer to have an ion implantation region and a diffusion region.

According to general aspects, both breakdown voltage characteristic and operation current characteristic suitable for a high-voltage semiconductor device may be realized by forming each of the deep well and the buried impurity layer to have an ion implantation region and a diffusion region.

While the description has been described with reference to general aspects thereof with particular details, it will be apparent to one of ordinary skill in the art that various changes may be made to these aspects without departing from the principles and spirit of the description, the scope of which is defined in the following claims.

What is claimed is:

1. A lateral double-diffused metal oxide semiconductor (LDMOS) transistor, semiconductor device, comprising:
   a substrate of first conductivity type;
   a semiconductor layer of second conductivity type formed above the substrate, the semiconductor layer including a first region having a uniform impurity concentration that is substantially uniform throughout the first region and a second region of varying impurity concentration that is the highest at a boundary between the first and second regions, and that is the lowest farthest away from the boundary;
   a first well of first conductivity type formed in the second region of the semiconductor layer, a source region of second conductivity type being formed in the first well; and
   a second well of second conductivity type formed in the first region of the semiconductor layer, a drain region of second conductivity type being formed in the second well.

2. The semiconductor device of claim 1, further comprising:
   a buried impurity layer of second conductivity type formed between the substrate and the semiconductor layer, the buried impurity layer having an impurity concentration that is higher than the uniform impurity concentration of the first region of the semiconductor layer.

3. The semiconductor device of claim 1, further comprising:
   a buried impurity layer of second conductivity type formed between the substrate and the semiconductor layer, the buried impurity layer including a first impurity layer region and a second impurity layer region, the first impurity layer region having an impurity concentration that is substantially uniform throughout the first impurity layer region and that is higher than the uniform impurity concentration of the first region of the semiconductor layer, the second impurity layer region having impurity concentration that varies across the second impurity layer region in such a manner that the impurity concentration of the second impurity layer region is the highest at a region boundary between the first and second impurity layer regions, and is the lowest farthest away from the region boundary.

* * * * *